United States Patent
Bailat et al.

(10) Patent No.: US 8,723,020 B2
(45) Date of Patent: May 13, 2014

(54) TEXTURED TRANSPARENT CONDUCTIVE LAYER AND METHOD OF PRODUCING IT

(75) Inventors: Julien Bailat, Glovelier (CH); Christophe Ballif, Neuchâtel (CH); Didier Domine, Neuchâtel (CH)

(73) Assignee: Universite de Neuchatel, Neuchatel (CH)

( * ) Notice: Subject to any disclaimer, the term of this patent is extended or adjusted under 35 U.S.C. 154(b) by 1235 days.

(21) Appl. No.: 12/294,936

(22) PCT Filed: Feb. 13, 2007

(86) PCT No.: PCT/EP2007/051375
§ 371 (c)(1),
(2), (4) Date: Sep. 29, 2008

(87) PCT Pub. No.: WO2007/113037
PCT Pub. Date: Oct. 11, 2007

(65) Prior Publication Data
US 2010/0126575 A1 May 27, 2010

(30) Foreign Application Priority Data

Mar. 30, 2006 (EP) .................................. 06112013

(51) Int. Cl.
*H01L 31/00* (2006.01)

(52) U.S. Cl.
USPC ........... 136/256; 136/258; 136/260; 136/261; 136/263; 136/264

(58) Field of Classification Search
USPC ................... 136/256, 258, 260, 261, 263, 264
See application file for complete search history.

(56) References Cited

U.S. PATENT DOCUMENTS

| 3,941,672 A | * | 3/1976 | Tanaka et al. .................... 438/85 |
| 4,532,537 A | | 7/1985 | Kane et al. |
| 2001/0037823 A1 | * | 11/2001 | Middelman et al. .......... 136/251 |
| 2002/0050289 A1 | | 5/2002 | Wada et al. |
| 2002/0134425 A1 | | 9/2002 | Yamamoto et al. |
| 2003/0044539 A1 | * | 3/2003 | Oswald ......................... 427/404 |
| 2004/0235286 A1 | | 11/2004 | Kroll et al. |
| 2005/0172997 A1 | * | 8/2005 | Meier et al. ................... 136/261 |

FOREIGN PATENT DOCUMENTS

| DE | 197 13 215 A1 | 10/1998 |
| EP | 0 698 929 A2 | 2/1996 |
| EP | 1 443 527 A1 | 8/2004 |
| JP | 62-297462 A | 12/1987 |

OTHER PUBLICATIONS

Ip et al., "Effect of high-density plasma etching on the optical properties and surface stoichiometry of ZnO," Appl. Phys. Lets., vol. 81, No. 19, pp. 3546-3548 (Nov. 4, 2002).

(Continued)

*Primary Examiner* — Thanh-Truc Trinh
(74) *Attorney, Agent, or Firm* — Young & Thompson

(57) ABSTRACT

The textured transparent conductive layer according to the invention is deposited on a substrate intended for a photoelectric device and exhibiting a surface morphology formed from a sequence of humps and hollows. It is characterized in that its hollows have a rounded base with a radius of more than 25 nm; the said hollows are virtually smooth, which is to say that, where they exhibit microroughnesses, these microroughnesses have a height on average of less than 5 nm; and its flanks form an angle with the plane of the substrate whose median of the absolute value is between 30° and 75°.

15 Claims, 2 Drawing Sheets

(56) References Cited

OTHER PUBLICATIONS

Yamamoto, "Very Thin Film Crystalline Silicon Solar Cells on Glass Substrate Fabricated at Low Temperature," IEEE Trans. on Elec. Dev., vol. 46, No, 10, pp. 2041-2047 (Oct. 10, 1999).

Han et al., "Jet Vapor Deposition of Transparent Conductive ZnO:Al Thin Films for Photovoltaic Applications", Met. Res. Soc. Symp. Proc. vol. 426, pp. 491-496 (1996).

Hu et al., "Textured Fluorine-Doped ZnO Films by Atmospheric Pressure Chemical Vapor Deposition and Their Use in Amourphous Cilicon Solar Cells", Solar Cells, vol. 30, pp. 437-450 (1991).

Boyle et al., "Novel Low Temperature Solution Deposition of Perpendicularly Orientated Rods of ZnO: Substrate Effects and Evidence of the Importance of Counter-Ions in the Control of Crystallite Growth", The Royal Society of Chemistry, pp. 80-81, (2002).

Groenen et al. "Surface Textured ZnO Films for Thin Film Solar Cell Application SBY Expanding Thermal Plasma CVD", Elsevier Science B.V., Thin Solid Films, Vold 392, pp. 226-230, (2001).

Kim et al., "The Effect of Substrate Temperature and RF Power on the Growth Rate and the Orientation of ZnO Thin Films Perpared by Plasma Enhanced Chemical Vapor Deposition", Elsevier Science B.V., Materials Letters 21, pp. 351-356, (Nov. 1994).

Yoshino et al., "Large-Area ZnO Thin Films for Solar Cells Prepared by Photo-Induced Metalorganic Chemical Vapor Deposition", Jpn. J. Appl. Phys. vol. 32, pp. 726-730, (1993).

Gordillo et al., "Preparation and Optoelectronic Characterization of ZnO Thin Films Deposited by Reactive Evaporation", Thin Film Cells and Technologies, pp. 750-753.

Selvan et al., "The Fiber Texture Growth and the Surface Roughness of Zno Thin Films", Mat. Res. Soc. Symp. Proc. vol. 471, Material Research Society, pp. 39-44.

Nunes et al., "Properties Presented by Zinc Oxide Films Deposited by Spray Pyrolysis", 16th European Photovoltaic Solar Energy Conference, pp. 899-902, (2000).

\* cited by examiner

TEXTURED TRANSPARENT CONDUCTIVE LAYER AND METHOD OF PRODUCING IT

BACKGROUND OF THE INVENTION

1. Field of the Invention

The present invention relates to the field of photoelectric devices. It more particularly concerns a transparent conductive layer deposited on a substrate intended for a photoelectric device in thin layers. A layer of this type is most often called, by specialized, a TCO (transparent conductive oxide) layer or electrode. The invention also concerns a method for producing this electrode.

2. Description of the Related Art

Application of the present invention is particularly interesting for producing photovoltaic cells intended for the production of electrical energy, but it is also applicable, more generally, to any structure in which light radiation is converted into an electrical signal, such as photodetectors.

In the current state of the art, photoelectric devices in thin layers, typically having a thickness smaller than 10 μm, are made up of a substrate that is transparent or not, flexible or stiff, and, deposited on this substrate, a photoelectrically active layer made up of an inorganic semi-conductor material or, more rarely, an organic one, and contacted on both sides by two electrodes, at least one of which is transparent. The semi-conductor layer is generally formed by the stacking of a p-type layer, an intrinsic-type active layer, and an n-type layer, together forming a p-i-n or n-i-p junction. The material used is primarily amorphous silicon or hydrogenated microcrystalline. In the case of an organic photoelectrically active layer, this is generally formed by stacking a p-type layer and an n-type layer. The material used is then, for example, a polymer.

In order to limit the production costs of the photoelectric device, the intrinsic active layer must be relatively thin (between 100 nm and several microns). However, such a layer leads to a weak quantity of light absorbed, particularly for indirect gap materials, such as microcrystalline silicon and, as a result, a reduced effectiveness. To offset this effect, it is therefore necessary to increase the optical path of the light as much as possible within the intrinsic layer. This is generally done through the use of a textured TCO substrate or layer, making it possible to diffuse or diffract the incident light, and thereby to increase the length of the path of the light in the active layer.

Document DE 197 13 215 describes a solar cell whereof the substrate is covered with a TCO layer, advantageously in zinc oxide (ZnO), formed by cathode sputtering into an argon atmosphere from a ZnO target doped with aluminum. In order to grant a roughness to this TCO layer, normally without asperities, it is etched either through a chemical method using an acid solution, or through an electrochemical method (anodic etching or reactive ion etching). The etching can be done during or after deposition of the TCO layer.

This type of method does, however, suffer several drawbacks. First, the cathode sputtering equipment and the necessary targets are relatively expensive, which substantially overloads the price of the cells thus produced. Secondly, etching of the TCO layer is delicate. It must therefore be dosed carefully, failing which one obtains, for the TCO layer, a surface morphology, in particular large craters, which is not favorable to optical trapping, as well as interruptions which are not very favorable to good later growth of the photoelectric layer.

Document JP 62-297 462 proposes depositing a TCO layer by evaporation—and not chemically—and interrupting this operation to soften the surface of the layer by argon plasma etching.

Such an approach, applied to the production of a photovoltaic cell, would lead, due to the deposition by evaporation, to a film of very low roughness, clearly insufficient, in any case, to grant it a an acceptable optical trapping capacity for this application. The action of an argon plasma on the deposited layer would again serve to reduce the roughness of the layer, which would make it practically incapable of providing the optical trapping function of a photovoltaic cell.

One indication of the optical trapping capacity of a layer is provided by the "Haze factor", which assumes the value of 0% when no part of the incident light is diffused and the value of 100% when all of the light received is diffused. Of course, the "Haze factor" of a solar cell must have as high a value as possible, typically 10% minimum.

The values provided in the abovementioned JP document, however, are 2 to 5% before the action of the argon plasma and 0.5% after treatment, respectively. These values clearly show that argon plasma etching of a layer deposited by evaporation is not aimed at the field of photovoltaic cells.

Document EP 1 443 527 describes a textured TCO layer having a surface morphology formed of a sequence of flat hollows which possess a number of micro-asperities having a base from 0.1 to 0.3 μm, a height from 0.05 to 0.2 μm and a pitch (distance between the peaks) from 0.1 to 0.3 μm. Such micro-asperities do not, however, lend themselves particularly well to good later growth of the photoelectric layer. Moreover, due to their small size, they do not increase light trapping very much in the range of interest (red and infra-red). Moreover, the fact that the hollows are flat has the drawback of increasing reflection of the light and, because of this, decreasing the light injected into the photovoltaic device, thereby reducing the photo-generated current accordingly.

SUMMARY OF THE INVENTION

One of the aims of the present invention is to provide a TCO layer having a good light trapping capacity while also ensuring satisfactory later growth of the photoelectric layer.

More precisely, the invention concerns a textured transparent conductive layer deposited on a substrate intended for a photoelectric device, and having a surface morphology formed from a sequence of humps and hollows. According to the invention, this layer is characterized in that
  its hollows have a rounded base with a radius of more than approximately 25 nm,
  said hollows are virtually smooth, which is to say that where they exhibit microroughnesses, these microroughnesses have an average height of less than 5 nm, and
  its flanks form an angle with the plane of the substrate whose median of the absolute value is between 30° and 75°.

The invention also concerns a method for realization, on a substrate intended for a photoelectric device, of a textured transparent conductive layer. This method includes the following main operations:
  chemical deposition on the substrate of a rough layer diffusing the light, and
  etching of this rough layer with a plasma in order to grant it a morphology favorable to good later growth of a photoelectric layer deposited on it, without significant decrease of its power to diffuse the incident light.

BRIEF DESCRIPTION OF THE DRAWING FIGURES

Other characteristics of the invention will appear from the following description, done in reference to the appended drawing, in which.

DETAILED DESCRIPTION OF THE INVENTION

Figure 1:
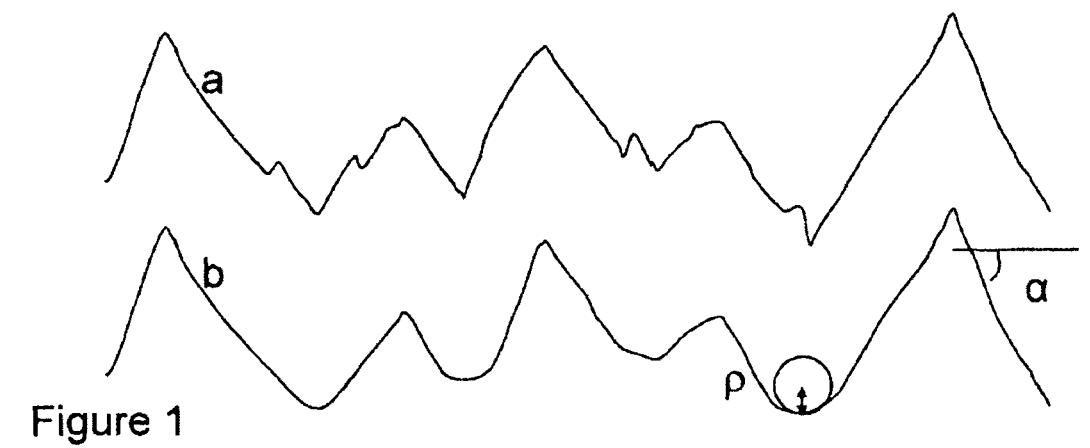
FIG. 1 illustrates the profile (height according to the position) of a layer of ZnO deposited chemically, before (a) and after (b) its argon plasma etching, respectively.

Before providing a description of the TCO layer according to the invention and its production method, we will recall that a photoelectric device, whether it involves a solar cell or a photodetector, is characterized by its conservation performance η and its optical trapping capacity, the first depending on the second, as long as the collection of photogenerated current is good.

The conservation performance η of a device of this type is given by the ratio between the electric power supplied by the device and the candle power received, the power supplied being equal to the product:

$$\text{Short-circuit current}(I_{sc}) \times \text{Open circuit voltage}(V_{oc}) \times \text{Fill factor(FF)}.$$

A good indication of the optical trapping capacity is given by the photocurrent density ($I_{inv}$) provided by the cell under reverse voltage, this reverse voltage making it possible to extract all photo-generated carrier current and thereby to evaluate the maximum current density of the device, independently of the values of $V_{oc}$ and FF.

The method according to the invention comprises two essential operations, performed on a substrate intended for a photoelectric device, which can be made in plastic, metal, glass or any other insulating or conductive material, flexible or stiff.

The first operation is the deposition, on the substrate, of a layer of transparent conductive oxide (TCO), made up in particular of $SnO_2$, ZnO, ITO, $In_2O_3$, $Cd_2SnO_4$, ... or a combination of these oxides, typically having a thickness in the vicinity of 0.05 to 10 μm. According to the invention, the deposition is done chemically, this expression including inherently physical methods but in which a chemical reaction takes place.

Advantageously, the deposition is done using one of the techniques listed below non-exhaustively, with references to the literature concerning them:

Low-pressure CVD (LPCVD): EP 0 204 563.

Atmospheric pressure CVD (APCVD): "Textured fluorine-doped ZnO films by atmospheric pressure chemical vapor deposition and their use in amorphous silicon solar cells", Jianhua Hu and Roy G. Gordon, Solar Cells, Vol. 30 (1991), p, 437-450.

Photo-induced metalorganic CVD (photo-MOCVD): "Large area ZnO thin films for solar cells prepared by photo-induced metalorganic chemical vapor deposition", Masahiro Yoshino, Wilson W. Wenas, Akira Yamada, Makoto Konagai and Kioshi Takahashi, Japanese Journal of Applied Physics, Vol. 32 (1993), p. 726-730, Part 1, No. 2.

Chemical bath deposition (CBD): "Novel temperature solution deposition of perpendicularly orientated rods of ZnO: substrate effects and evidence of the importance of counter-ions in the control of crystallite growth", David S. Boyle, Kuveshni Govender and Paul O'Brien, Chemical Communications, (2002), p. 80-81.

Reactive evaporation: "Preparation and optoelectronic characterization of ZnO thin films deposited by reactive evaporation", G. Gordillo, C. Calderón, J. Olarte, J. Sandino and H. Méndez, Proceedings of the $2^{nd}$ world conference and exhibition on photovoltaic solar energy conversion, 6-10 July 1998, Vienna, Austria, Thin Film Cells and Technologies, Vol B5 (1998), p. 750-753.

Plasma enhanced CVD (PECVD): "Surface texture ZnO films for thin film solar cell applications by expanding thermal plasma CVD", R. Groenen, J. Löffler, P. M. Sommeling, J. L. Linden, E. A. G. Hamers, R. E. I Schropp, M. C. M. van de Sanden, Thin Solid Films 392 (2001), p. 226-230. "The effect of substrate temperature and rf power on the growth rate and the orientation of ZnO thin films prepared by plasma enhanced chemical vapor deposition" Young Jin Kim, Hyeong Joon Kim, Materials Letters 21, (1994), p. 351-356.

Vapor jet: "Jet vapor deposition of transparent conductive ZnO:Al thin films for photovoltaic applications", H. Han, J.-Z. Zhang, B. L. Halpern, J. J. Schmitt, and J. del Cueto, Material Research Society Proceedings Vol 426, (1997) p. 491-496.

Spray pyrolysis: "Properties presented by zinc oxide thin films deposited by spray pyrolysis", P. Nunes, E. Fortunato, P. Vilarinho, F. Braz Fernandes, R. Martins, Proceedings of the $16^{th}$ European Photovoltaic Solar Energy Conference, Glasgow Vol. 1 (2000), p. 899-902.

RF magnetron sputtering: "The fiber texture growth and the surface roughness of ZnO thin films", J. A. Anna Selvan, H. Keppner, U. Kroll, J. Cuperus, A. Shah, T. Adatte and N. Randall, Materials Research Society Proceedings Vol 472 (1997), p. 39-44.

Figure 3:
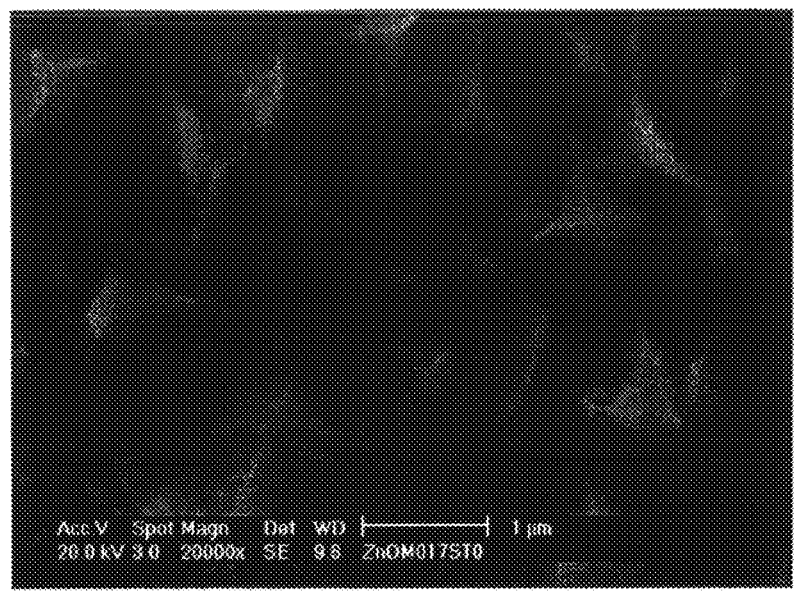
FIGS. 3 and 4 are outline views of this layer before and after its etching.

Measurements, presented below, demonstrate that the TCO layer thus obtained, as long as the deposition parameters are chosen carefully, has an excellent optical trapping capacity. However, as shown by profile (a) in FIG. 1 and the outline view in FIG. 3, this layer has a very rough surface made up of humps and hollows, which are generally V-shaped with relatively abrupt flanks. The curve radius p of these hollows is typically several nanometers. Such a morphology is not adapted to good later growth, from it, of the photoelectric layer which will make it possible to make a solar cell or a photodetector with good conversion performance from it. In particular, the hollows of the Vs are favorable locations, during the growth of the semi-conductive layers, for the appearance of cracks or fractures which risk causing recombinations of carriers and other electrical problems (short-circuits, etc. . . . ) which affect the conversion performance of the device.

Figure 2:
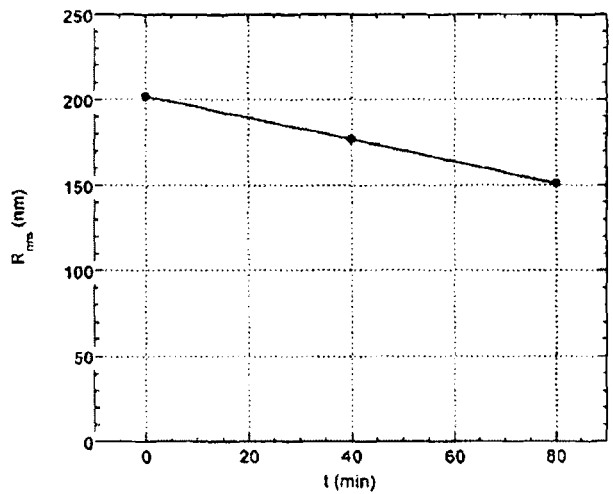
FIG. 2 is a graph showing the evolution of the roughness $R_{rms}$ of this layer according to the duration t of its etching.

The roughness of the chemically deposited TCO layer can be characterized by the standard deviation of the heights of the points constituting its "rms-roughness" surface whereof the value, shown in the graph of FIG. 2, is 202 nm.

Such a layer being poorly adapted, as already mentioned, despite its good optical trapping capacity, to have a photoelectric layer grow on it, the method according to the present invention corrects this weakness through a second operation which consists of etching the TCO layer using a rare gas plasma, such as helium (He), neon (Ne), argon (Ar), krypton (Kr), xenon (Xe) and radon (Rn). Tests have also shown that simple etching in atmosphere would achieve the desired effect. The etching could be done using at least one other gas such as hydrogen ($H_2$), oxygen ($O_2$), nitrogen ($N_2$), chlorine ($Cl_2$), methane ($CH_4$), water ($H_2O$) and carbon dioxide ($CO_2$). Preferably, the etching is done using an argon plasma.

A description of the plasma etching technique is provided, for example, in the publication "Effect of high-density plasma etching on the optical properties and surface stoichiometry of ZnO" by K. Ip et al. Applied Physics Letters, vol 81 number 19, p. 3546, 2002.

The equipment used can be the Reactive ion etcher IPL 200E machine from the company Integrated Plasma Limited. As a non-limiting example, the etching conditions may be the following:
Power: 1 $W/cm^2$
Pressure: 90 mTor
Frequency: 13.56 Mhz
Ambient temperature
Gas: argon.

Figure 4:
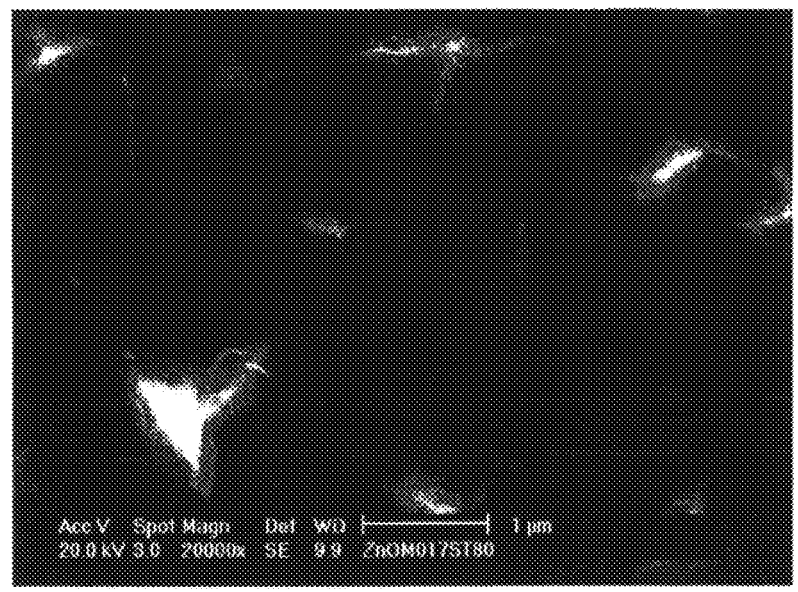

Surprisingly, as shown by the measurements done, presented below, etching of this type does not substantially reduce the trapping capacity of the TCO layer. However, as shown by profile (b) of FIG. 1 and FIG. 4, the layer remains rough, its points remaining raised, while its hollows assume a U shape, therefore with a base substantially more rounded than in the cases of V-shaped valleys. Typically, the curve radius p (FIG. 1) of the bases is greater than approximately 25 nm. Moreover, the bases are virtually smooth, which is to say that where they exhibit microroughnesses, these microroughnesses have an average height of less than 5 nm and a surface roughness, determined by the standard deviation of the heights of the points constituting its surface, of less than 3 nm. This type of morphology is ideal for good later growth of the photoelectric layer, which will make it possible to make a solar cell or a photodetector free of fractures from it.

Because of the plasma etching of the layer, the standard deviation of its "rms-roughness" surface, also shown in the graph in FIG. 2, went from 202 nm to 177 nm after 40 minutes and to 151 nm after 80 minutes.

Typically, the TCO layer according to the invention also advantageously presents the following main geometric characteristics:
its flanks form, with the plane of the substrate, an angle α (FIG. 1) whereof the median of the absolute value is between approximately 30° and 75°;
the standard deviation of the heights of the points forming its surface is between approximately 40 and 250 nm;
the vertical gap between its humps and hollows is between approximately 100 and 800 nm;
the distance between the peaks of the humps is between approximately 100 and 1500 nm.

Regarding the angle α formed by the flanks of the layer, one will note that a value of less than 30° results in weak optical trapping, while a value of more than 75° causes poor growth of the layer subsequently deposited.

Thus, the initial TCO layer, deposited chemically, which had a good optical trapping capacity but a morphology not suited to good later growth of the photoelectric layer, still has, thanks to its plasma etching, both a good trapping capacity and a morphology well suited to the growth of the photoelectric layer.

Figure 5:
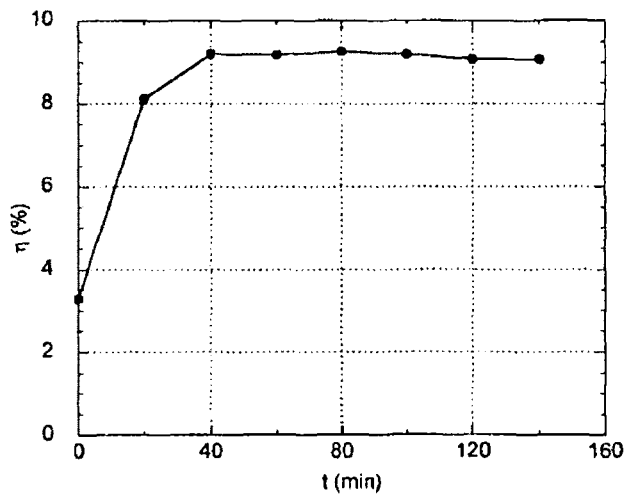
FIG. 5 is a graph showing the effectiveness q, according to the duration t of plasma etching, of a photoelectric device provided with a layer of this type.

One will also refer to the graph in FIG. 5, which shows the improvement, according to the duration t of the plasma etching, of the conversion performance η of a hydrogenated microcrystalline silicon photoelectric device provided with a substrate covered with a TCO layer deposited chemically. Here, the layers of microcrystalline silicon are deposited using the PECVD ("plasma-enhanced chemical vapor deposition") method. It should be noted that the value of η before etching is only 3.3% initially, but that it increases to 9.2% after 40 minutes and remains constant afterwards. An optimal duration for plasma treatment under the abovementioned operating conditions is therefore approximately 40 minutes. The standard deviation of the roughness then only goes down to a value less than 180 nm, still completely satisfactory for optimal trapping of light in the cell.

The table below shows, as an example, the evolution of the various characteristics (previously mentioned) of a hydrogenated microcrystalline silicon photoelectric device provided with a TCO layer chemically deposited before and after its plasma etching.

|  | $I_{inv}$ (mA/$cm^2$) | $\Delta I_{inv}/I_{inv}$ (%) | $V_{oc}$ (mV) | $\Delta V_{oc}/V_{oc}$ (%) | FF (%) | $\Delta FF/FF$ (%) | η (%) | $\Delta \eta/\eta$ (%) |
|---|---|---|---|---|---|---|---|---|
| W/o treat. | 25.2 | 0 | 441 | 0 | 42.3 | 0 | 3.3 | 0 |
| 40 min. | 25.7 | +2.0 | 528 | +19.7 | 69.2 | +63.6 | 9.2 | +238 |
| 60 min. | 24.9 | −1.2 | 534 | +21.1 | 70.4 | +66.4 | 9.2 | +238 |

One can make the following remarks:
The photo-current density $I_{inv}$ provided under reverse voltage, which is an indicator of the optical trapping capacity of the device, is virtually unaffected by the plasma etching.

The open circuit voltage $V_{oc}$ and the fill factor FF, both of which contribute to the conversion performance of the device, are very greatly improved since after 60 minutes of etching, they make leaps of 21.1% and 66.4%, respectively.

Lastly, the conversion performance η makes a jump of 238%.

The preceding clearly shows that the combination of two known operations, namely the chemical deposition of a TCO layer then its plasma etching, makes it possible to provide a photoelectric device with a substrate which grants it excellent conversion performance and an excellent optical trapping capacity.

It must also be noted that, due to the plasma etching, the production performance of the layer obtained by the method according to the invention is greater than 95%, while it is 60%, on average, when one uses other methods. This is due to the fact that the plasma treatment effectively eliminates all of the dust and particles present in the working environment, which would risk short circuiting the cells.

Of course, any photoelectric device in thin layers can benefit from the substrate according to the invention. It may, for example, involve one of the following devices:

solar cell in hydrogenated amorphous silicon,
solar cell in hydrogenated microcrystalline silicon,
multi-junction type cell with thin layers,
"tandem" solar cell comprising an amorphous silicon junction and a microcrystalline silicon junction,
cadmium telluride solar cell,
chalcopyrite-based solar cell, for example with $Cu(In_xGa_{1-x})Se_2$,
solar cell with an amorphous silicon and germanium alloy base,
organic or photodetector solar cell with one of the above-mentioned materials.

The invention claimed is:

1. A textured transparent conductive layer deposited on a substrate intended for a photoelectric device and having a surface morphology formed from a sequence of humps and hollows, wherein:
    said hollows have a rounded base, a radius of which is greater than 25 nm;
    said hollows are virtually smooth where they exhibit microroughnesses, these microroughnesses having an average height of less than 5 nm; and
    flanks form an angle with a plane of the substrate whereof the median of the absolute value is between 30° and 75°.

2. The conductive layer according to claim 1, wherein roughness of the layer, determined by a standard deviation of heights of points constituting a surface of the layer, is between 40 and 250 nm.

3. The conductive layer according to claim 2, wherein the roughness of the hollows, determined by the standard deviation of the heights of the points constituting their surface, is smaller than 3 nm.

4. The conductive layer according to claim 1, wherein a gap between said humps and said hollows is between 100 and 800 nm.

5. The conductive layer according to claim 1, wherein a distance between peaks of said humps is between 100 and 1500 nm.

6. The conductive layer according to claim 2, wherein a gap between said humps and said hollows is between 100 and 800 nm.

7. The conductive layer according to claim 3, wherein a gap between said humps and said hollows is between 100 and 800 nm.

8. The conductive layer according to claim 1, wherein the conductive layer is part of an amorphous silicon solar cell.

9. The conductive layer according to claim 1, wherein the conductive layer is part of a microcrystalline silicon solar cell.

10. The conductive layer according to claim 1, wherein the conductive layer is part of a multi-junction cell with thin layers.

11. The conductive layer according to claim 1, wherein the conductive layer is part of a solar cell comprising an amorphous silicon junction and a microcrystalline silicon junction.

12. The conductive layer according to claim 1, wherein the conductive layer is part of a cadmium telluride solar cell.

13. The conductive layer according to claim 1, wherein the conductive layer is part of a chalcopyrite-based solar cell.

14. The conductive layer according to claim 1, wherein the conductive layer is part of a solar cell with an amorphous silicon and germanium alloy base.

15. The conductive layer according to claim 1, wherein the conductive layer is part of an organic or photodetector solar cell.

* * * * *